United States Patent
Chen et al.

(10) Patent No.: US 9,722,823 B2
(45) Date of Patent: Aug. 1, 2017

(54) OFFSET CALIBRATION FOR LOW POWER AND HIGH PERFORMANCE RECEIVER

(71) Applicant: QUALCOMM Incorporated, San Diego, CA (US)

(72) Inventors: Minhan Chen, Cary, NC (US); Kenneth Luis Arcudia, Cary, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/175,990

(22) Filed: Jun. 7, 2016

(65) Prior Publication Data
US 2016/0294583 A1     Oct. 6, 2016

Related U.S. Application Data

(63) Continuation of application No. 14/298,718, filed on Jun. 6, 2014, now Pat. No. 9,385,695.

(51) Int. Cl.
| | |
|---|---|
| *H04L 25/06* | (2006.01) |
| *H03K 5/003* | (2006.01) |
| *H04B 1/16* | (2006.01) |
| *H04L 25/02* | (2006.01) |
| *H04L 25/03* | (2006.01) |

(52) U.S. Cl.
CPC .......... *H04L 25/061* (2013.01); *H03K 5/003* (2013.01); *H04B 1/16* (2013.01); *H04L 25/0272* (2013.01); *H04L 25/0296* (2013.01); *H04L 25/03057* (2013.01)

(58) Field of Classification Search
CPC ............................ H03K 5/003; H04L 25/0296
USPC .................................. 375/316, 319; 327/307
See application file for complete search history.

(56) References Cited

U.S. PATENT DOCUMENTS

| | | |
|---|---|---|
| 6,897,700 B1 | 5/2005 | Fu et al. |
| 7,233,164 B2 | 6/2007 | Stojanovic et al. |
| 7,321,259 B1 | 1/2008 | Shumarayev |
| 7,623,600 B2 | 11/2009 | Momtaz et al. |

(Continued)

FOREIGN PATENT DOCUMENTS

WO    WO-2013039624 A1    3/2013

OTHER PUBLICATIONS

International Search Report and Written Opinion—PCT/US2015/030209—ISA/EPO—Jul. 21, 2015.

*Primary Examiner* — Leila Malek

(74) *Attorney, Agent, or Firm* — Loza & Loza, LLP/Qualcomm

(57) ABSTRACT

Systems and methods for providing offset calibration for low power and high performance receivers are described herein. In one embodiment, a receiver comprises a sample latch having a first input coupled to a receive data path, and a second input. The receive also comprises a first digital-to-analog converter (DAC), a second DAC, and a calibration controller. In a calibration mode, the calibration controller is configured to input a calibration voltage to the first input of the sample latch using the first DAC, to input a threshold voltage and an offset-cancelation voltage to the second input of the sample latch using the second DAC, to adjust the offset-cancelation voltage, to observe an output of the sample latch as the offset-cancelation voltage is adjusted, and to store a value of the offset-cancelation voltage at which a metastable state is observed at the output of the sample latch in a memory.

24 Claims, 8 Drawing Sheets

(56) References Cited

U.S. PATENT DOCUMENTS

| | | |
|---|---|---|
| 7,675,997 B2 | 3/2010 | Yui et al. |
| 7,822,114 B2 | 10/2010 | Bulzacchelli et al. |
| 7,868,663 B2 | 1/2011 | Oh et al. |
| 8,135,100 B2 | 3/2012 | Beukema et al. |
| 8,385,496 B1 | 2/2013 | Chan et al. |
| 9,385,695 B2 | 7/2016 | Chen et al. |
| 2006/0067440 A1 | 3/2006 | Hsu et al. |
| 2009/0146722 A1 | 6/2009 | Chen et al. |
| 2012/0086494 A1 | 4/2012 | Asada et al. |
| 2012/0106687 A1 | 5/2012 | Bulzacchelli et al. |
| 2012/0269305 A1 | 10/2012 | Hogeboom et al. |
| 2014/0169426 A1* | 6/2014 | Aziz ............... H04L 25/03057 375/224 |
| 2015/0085957 A1* | 3/2015 | Jing ............... H04L 25/03057 375/319 |

* cited by examiner

OFFSET CALIBRATION FOR LOW POWER AND HIGH PERFORMANCE RECEIVER

RELATED APPLICATION

This application is a continuation of U.S. application Ser. No. 14/298,718 filed on Jun. 6, 2014.

BACKGROUND

Field

Aspects of the present disclosure relate generally to receivers, and more particularly, to offset calibration for low power and high performance receivers.

Background

A receiver may be used to receive a high-speed data signal over a channel (e.g., in a serializer/deserializer (SerDes) communication system). The receiver may split the received data signal among multiple data paths, where each data path comprises a sample latch (e.g., for sampling data from the data signal). Offset voltages at the sample latches may be high (e.g., due to component mismatches in the receiver) and the offset voltage for each sample latch may be different, which negatively impact performance of the receiver (e.g., cause closure of the data eye at the sample latches). Accordingly, it is desirable to cancel out the offset voltage at each sample latch to improve performance of the receiver.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

A first aspect relates to a method for offset calibration. In a calibration mode, the method comprises inputting a calibration voltage to a first input of a sample latch, inputting a threshold voltage and an offset-cancelation voltage to a second input of the sample latch, adjusting the offset-cancelation voltage, observing an output of the sample latch as the offset-cancelation voltage is adjusted, and storing a value of the offset-cancelation voltage at which a metastable state is observed at the output of the sample latch in a memory. In a data mode, the method comprises retrieving the value of the offset-cancelation voltage from the memory, setting the offset-cancelation voltage according to the retrieved value, inputting the threshold voltage and the set offset-cancelation voltage to the second input of the sample latch, and inputting a data signal to the first input of the sample latch.

A second aspect relates to an apparatus for offset calibration. The apparatus comprises means for inputting, in a calibration mode, a calibration voltage to a first input of a sample latch, means for inputting, in the calibration mode, a threshold voltage and an offset-cancelation voltage to a second input of the sample latch, means for adjusting, in the calibration mode, the offset-cancelation voltage, means for observing, in the calibration mode, an output of the sample latch as the offset-cancelation voltage is adjusted, and means for storing a value of the offset-cancelation voltage at which a metastable state is observed at the output of the sample latch in a memory. The apparatus also comprises means for retrieving, in a data mode, the value of the offset-cancelation voltage from the memory, means for setting, in the data mode, the offset-cancelation voltage according to the retrieved value, means for inputting, in the data mode, the threshold voltage and the set offset-cancelation voltage to the second input of the sample latch, and means for inputting, in the data mode, a data signal to the first input of the sample latch.

A third aspect relates to a receiver. The receiver comprises a sample latch having a first input coupled to a receive data path, and a second input. The receive also comprises a first digital-to-analog converter (DAC), a second DAC, and a calibration controller. In a calibration mode, the calibration controller is configured to input a calibration voltage to the first input of the sample latch using the first DAC, to input a threshold voltage and an offset-cancelation voltage to the second input of the sample latch using the second DAC, to adjust the offset-cancelation voltage, to observe an output of the sample latch as the offset-cancelation voltage is adjusted, and to store a value of the offset-cancelation voltage at which a metastable state is observed at the output of the sample latch in a memory.

To the accomplishment of the foregoing and related ends, the one or more embodiments comprise the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the described embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
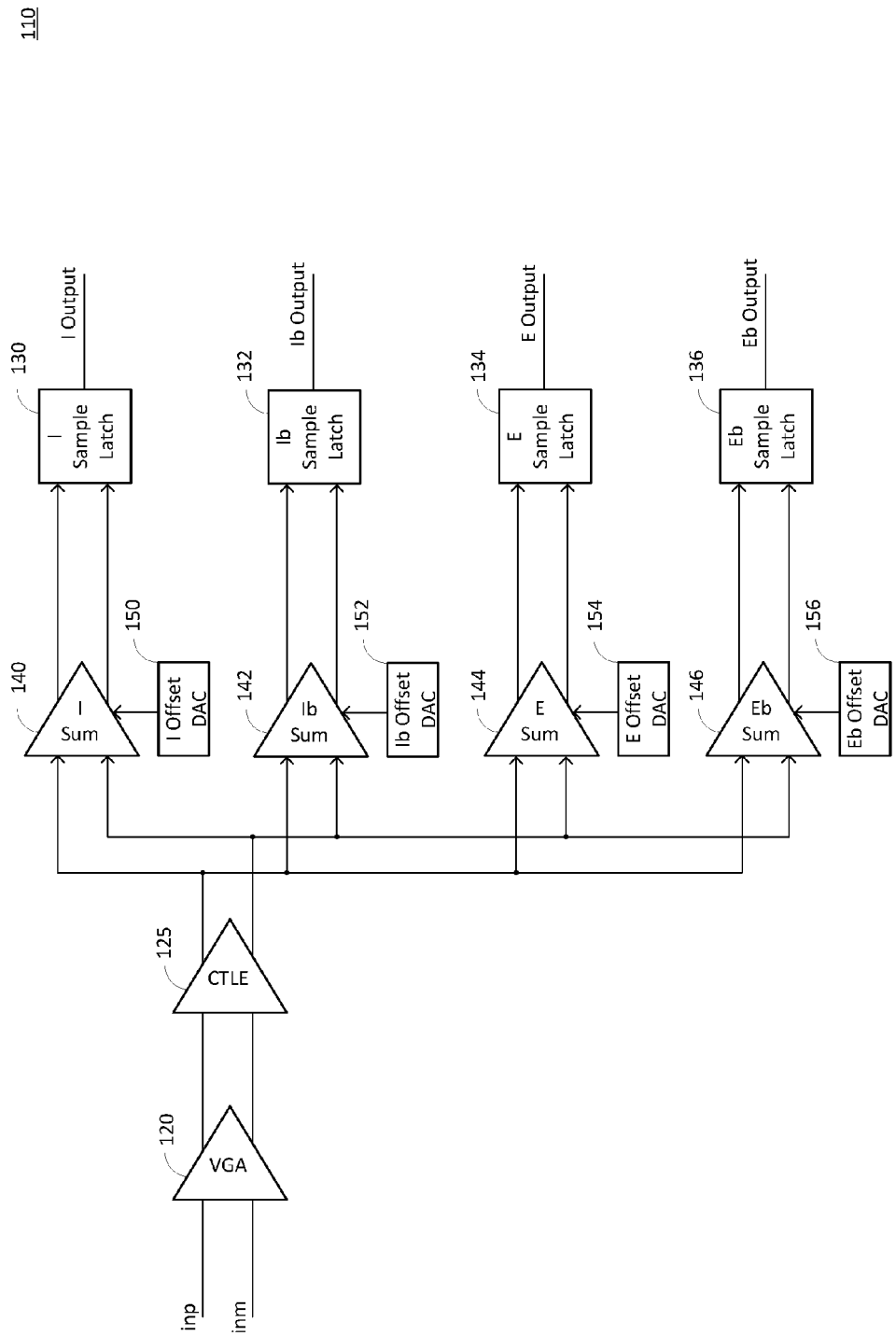
FIG. 1 shows an example of a receiver with multiple data paths and a separate summing amplifier for each data path.

FIG. 1 shows an example of a receiver 110 that may be used in a SerDes system for high-speed communication. In a SerDes system, parallel data at the transmitter may be serialized into a serial high-speed differential signal, and transmitted over a differential channel to the receiver. The receiver may amplify the signal and sample the signal to recover data (e.g., data bits) from the signal. The recovered data may be deserialized back into parallel data for further processing. In the example in FIG. 1, the receiver 110 receives a high-speed differential signal (denoted "inp" and "inm") from the channel. The transmitter and the receiver 110 may be located on the same chip or different chips. For chip-to-chip communication, the channel may comprise differential wire pairs, a cable, an optical fiber, etc.

The receiver 110 comprises a variable gain amplifier (VGA) 120 and a continuous-time linear equalizer (CTLE) 125. The VGA 120 is configured to amplify the received differential signal with variable gain, and the CTLE 125 is configured to correct for distortion of the signal due to high-frequency attenuation of the signal by the channel.

After the CTLE 125, the differential signal is split among four data paths in the receiver 110. Each data path comprises a sample latch 130 to 136, a summing amplifier 140 to 146, and a digital-to-analog converter (DAC) 150 to 156. Each DAC 150 to 156 receives a digital offset code, and converts the received offset code into an offset-cancelation voltage, which is output to the respective summing amplifier 140 to 146. Each summing amplifier 140 to 146 applies the offset-cancelation voltage from the respective DAC 150 to 156 to the signal in the respective data path. The offset-cancelation voltage is used to cancel out an offset voltage at the input of the respective latch due to, for example, component (e.g., transistor) mismatches in the respective latch, and/or other cause. The offset voltage may vary from latch to latch. Thus, the offset-cancelation voltage in each data path is individually controlled by the respective offset code input to the respective DAC 150 to 156. An offset calibration process for determining the offset-cancelation voltage for each data path is discussed further below.

The sample latches include an in-phase (I) sample latch 130 and a 180 degree out of phase Ib sample latch 132. Each of the I and Ib sample latches 130 and 132 samples data from the input signal at half the rate of the input data signal. More particularly, each latch 130 and 132 samples every other data bit of the input data signal. For example, the I latch sample latch 130 may sample even data bits and the Ib sample latch 132 may sample odd data bits, or vice versa. Thus, together, the I and Ib latches recover the data bits from the input data signal. In this example, each of the I and Ib latches 130 and 132 may sample data using a half-rate clock, in which the I latch 130 samples data on the rising edges of the clock and the Ib latch 132 samples data on the falling edges of the clock, or vice versa.

In one aspect, each of the I and Ib sample latches 130 and 132 may determine the bit value of a sample of the data signal (data sample) based on a threshold voltage of approximately zero volts. For example, a bit value of one may correspond to a differential voltage having a positive polarity and a bit value of zero may correspond to a differential voltage having a negative polarity, where the differential voltage is the voltage between the two lines of the differential input. In this example, each of the I and Ib latches 130 and 132 may determine a bit value of one if the differential voltage of a data sample is above zero volts and a bit value of zero if the differential voltage of a data sample is below zero volts.

The sample latches also include an error (E) sample latch 134 and an Eb sample latch 136, which are used to detect the voltage level of the differential data signal (i.e., voltage level between the two lines of the differential input), as discussed further below. The E sample latch 134 samples the data signal in phase with the I sample latch 130, and the Eb sample latch 136 samples the data signal in phase with the Ib sample latch 132. To detect the voltage level of the data signal, each of the E and Eb sample latches makes a bit-value decision for a data sample based on a threshold voltage corresponding to a target voltage level (e.g., a differential voltage level of at least 50 mV). For example, each of the E and Eb latches 134 and 136 may determine a bit value of one if the voltage level of a data sample is above the target voltage level and a bit value of zero if the voltage level of a data sample is below the target voltage level. Thus, in this example, a bit value of one indicates that the voltage level of the data signal is above the target voltage level, and a bit value of zero indicates that the voltage level of the data signal is below the target voltage level. The target voltage level may correspond to a voltage level that provides good detection of the data signal while staying within the linear ranges of amplifiers (e.g., summing amplifiers 140 to 146) in the receiver 110.

Offset-voltage cancelation is important in order to accurately detect whether the voltage level of a data signal at the E latch 134 is above or below the target voltage level. This is because, when the voltage level of the data signal is at the target voltage level, the output of the E latch 134 should be in a metastable state (toggle between zero and one). However, due to the offset voltage, the output of the E latch 134 is in a metastable state when the voltage level of the data signal is offset from the target voltage level, reducing the accuracy of the E latch 134. This is corrected for by canceling out the offset voltage, as discussed further below. The above discussion also holds for the Eb latch 136.

In this embodiment, an error processor (not shown in FIG. 1) may observe the outputs of the E and Eb latches 134 and 136 and adjust one or more parameters of an equalizer (e.g., CTLE 125) and/or gain of an amplifier (e.g., VGA 120) in the receiver 110 until the outputs of the E and Eb latches 134 and 136 reach a metastable state (toggle between one and zero). This occurs when the voltage level of the data signal is approximately equal to the target voltage level. Thus, the error processor may use the outputs of the E and Eb latches 134 and 136 to achieve a desired voltage level for the data signal.

An offset calibration process for determining the offset-cancelation voltages for the latches will now be described. First, the differential input signal to the data paths is set to approximately zero volts. For each latch, the magnitude and/or polarity of the respective offset-cancelation voltage is adjusted by adjusting the offset code to the respective DAC until the output of the latch reaches a metastable state (toggles between one and zero). This occurs when the offset-cancelation voltage cancels out the offset voltage at the latch. Thus, the offset-cancelation voltage for each latch is a voltage that cancels out the respective offset voltage at a differential input signal of approximately zero volts. This offset calibration process calibrates the offsets at small signal conditions (i.e., small differential input voltage levels).

Figure 2:
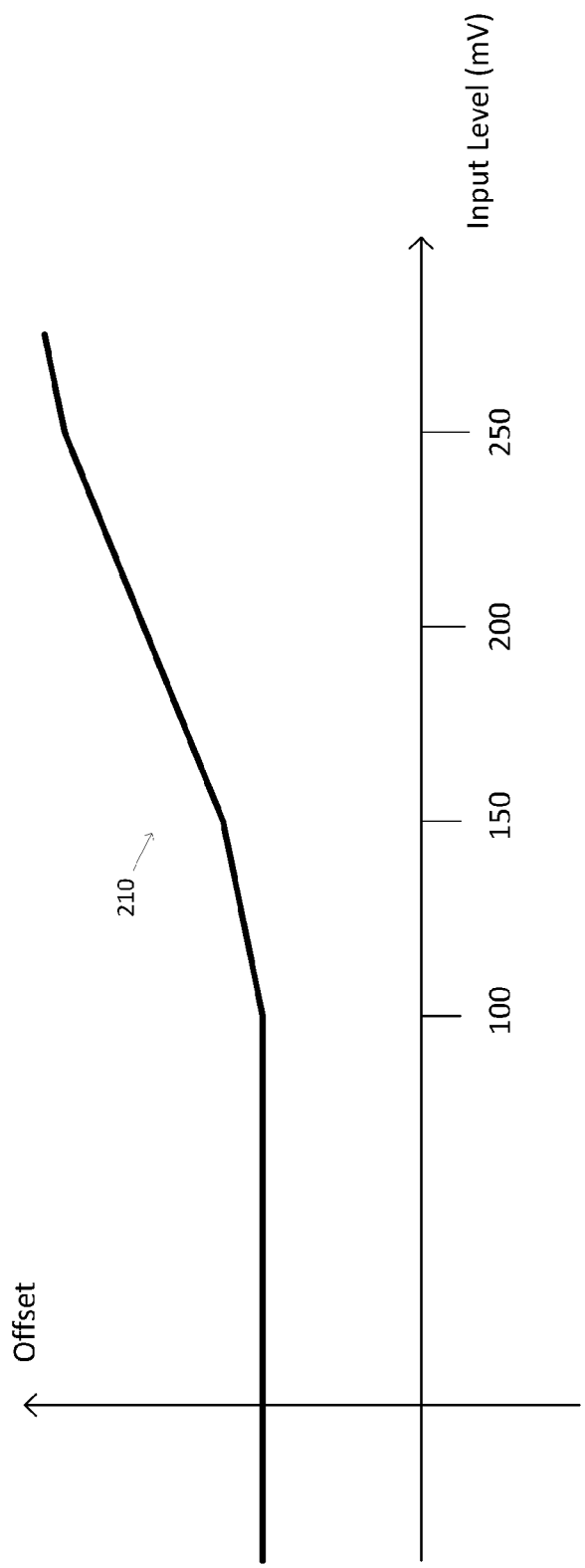
FIG. 2 is a plot showing offset at a latch as a function of input signal level.

A problem with this calibration approach is that the E and Eb sample latches 134 and 136 are used at large signal conditions (large differential input voltage levels) to detect the voltage level of the data signal while the offset calibration is performed at small signal conditions (small differential input voltage levels). The offset voltages of the latches at large signal conditions may differ significantly from the offset voltages of the latches at small signal conditions due to, for example, nonlinear nature of the latches. In this regard, FIG. 2 shows an example of the offset voltage 210 at the input of a latch as a function of input signal level (differential input voltage level). As shown in the example in FIG. 2, the offset voltage at a small signal condition (e.g., approximately zero volts) can differ significantly from the offset voltage at a large signal condition (e.g., 200 mV). As a result, the offset-cancelation voltages for the E and Eb latches 134 and 136 determined at small signal conditions do not properly cancel out the offset voltages of the E and Eb latches 134 and 136 at large signal conditions, negatively impacting the performance of the receiver 110.

The receiver 110 may also suffer from high power consumption. This is because the receiver 110 comprises a separate summing amplifier 140 to 146 for each sample latch 130 to 136, where each summing amplifier 140 to 146 consumes a relatively large amount of power.

Figure 3:
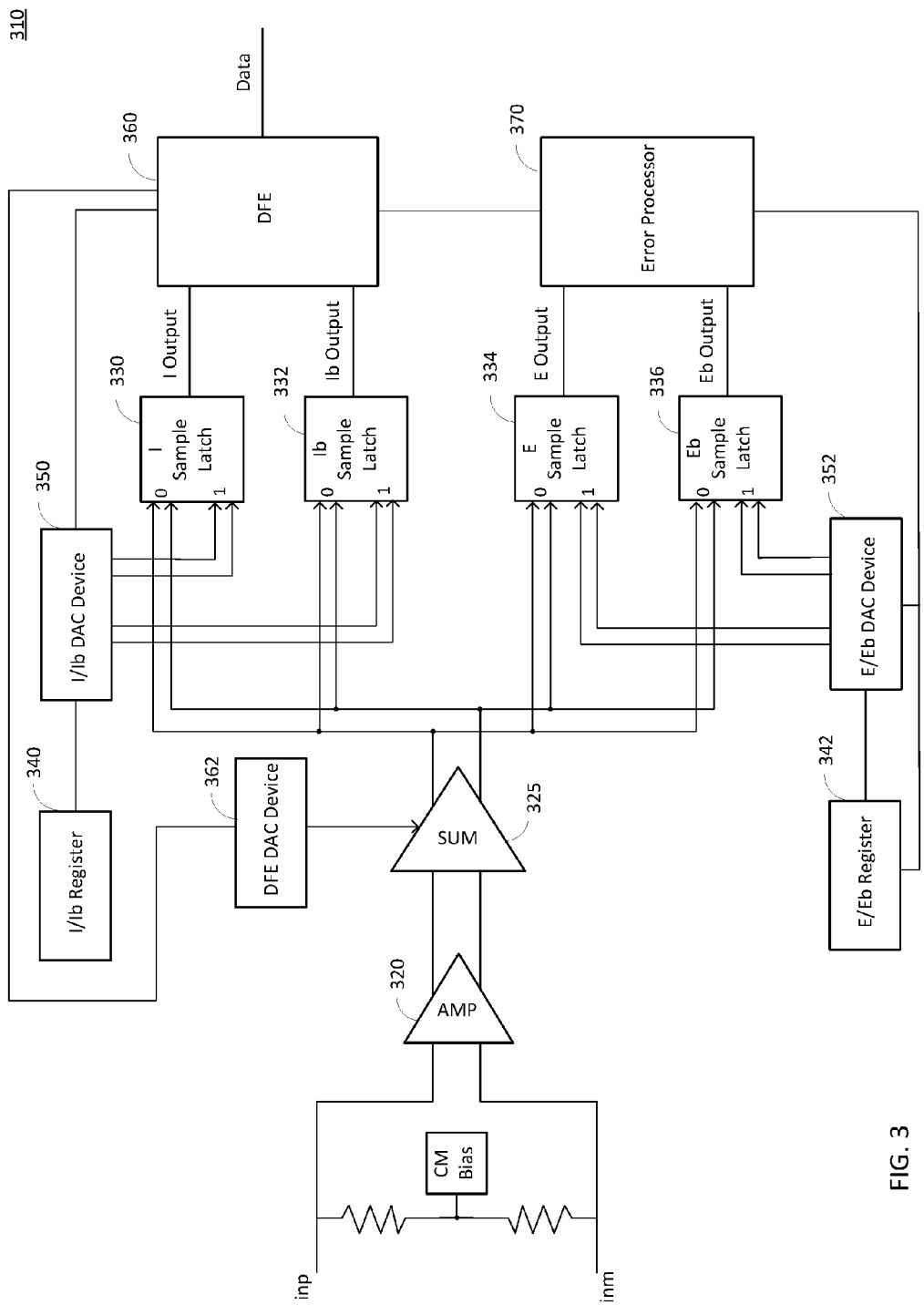
FIG. 3 shows a receiver comprising a summing amplifier driving multiple data paths according to an embodiment of the present disclosure.

FIG. 3 shows a low power high performance receiver 310 according to an embodiment of the present disclosure. The receiver 310 comprises an amplifier 320, a summing amplifier 325, I and Ib sample latches 330 and 332, and E and Eb sample latches 334 and 336.

The receiver 310 differs from the receiver 110 in FIG. 1 in that the offset-cancelation voltage for each latch 330 to 336 is injected at the latch instead of a corresponding summing amplifier. This allows one summing amplifier 320 to drive multiple latches 330 to 336, which reduces the number of summing amplifiers in the receiver and therefore power consumption.

As discussed further below, offset calibration for the E and Eb sample latches 334 and 336 is performed at large signal conditions, resulting in much more accurate offset-cancelation voltages for the E and Eb latches 334 and 336 compared with the prior approach, in which offset calibration is performed at small signal conditions for all latches. This results in much better offset cancelation for the E and Eb latches 334 and 336, greatly improving performance of the receiver 310.

In the following description, the receiver is described as operating in a "calibration mode" or a "data mode." As used herein, the term "calibration mode" may refer to a mode of operation in which offset-cancelation voltage(s) are determined for one or more of the latches. The term "data mode" may refer to a mode of operation in which the receiver processes a data signal received at the input of the receiver 110.

In the data mode, the amplifier 320 amplifies a differential input data signal (denoted "inp" and "inm"). The summing amplifier 325 applies a voltage to the input data signal to compensate for inter symbol interference (ISI), as discussed further below. The output of the summing amplifier 325 is split among multiple data paths where each data path corresponds to one of the latches 330 to 336. As a result, the summing amplifier 325 drives the latches 330 to 336. Each data path is coupled to a first differential input (denoted "0") of the respective latch 330 to 336.

The receiver 310 also comprises a decision feedback equalizer (DFE) 360 coupled to the outputs of the I and Ib latches 330 and 332, and an error processor 370 coupled to the outputs of the E and Eb latches 334 and 336. Operations of the DFE 360 and the error processor 370 are discussed further below.

The receiver 310 further comprises an I/Ib register 340 and I/Ib DAC device 350. The I/Ib DAC device 350 has a first differential output coupled to a second differential input (denoted "1") of the I sample latch 330, and a second differential output coupled to a second differential input (denoted "1") of the Ib sample latch 332. The first output of the I/Ib DAC device 350 outputs an offset-cancelation voltage to the second differential input (1) of the I latch 330 to cancel out the offset voltage at the I latch 330, where the offset-cancelation voltage is a voltage between the two lines of the second differential input (1). Similarly, the second output of the I/Ib DAC device 350 outputs an offset-cancelation voltage to the second differential input (1) of the Ib latch 332 to cancel out the offset voltage at the Ib latch 332, where the offset-cancelation voltage is a voltage between the two lines of the second differential input (1).

The offset-cancelation voltage for each latch 330 and 332 may be specified by a corresponding digital offset code stored in the I/Ib register 340. In this embodiment, the I/Ib register 340 inputs the offset code for each latch 330 and 332 to the I/Ib DAC device 350 to generate the corresponding offset-cancelation voltage. The I/Ib DAC device 350 may comprise a separate DAC for each latch, in which the DAC for each latch receives the offset code for the latch from the I/Ib register 340, and outputs the corresponding offset-cancelation voltage to the latch. An offset calibration process for determining the offset-cancelation voltages for the I and Ib latches 330 and 332 at small signal conditions is discussed further below.

The receiver 310 further comprises an E/Eb register 342 and E/Eb DAC device 352. The E/Eb DAC device 352 has a first differential output coupled to a second differential input (denoted "1") of the E sample latch 334, and a second differential output coupled to a second differential input (denoted "1") of the Eb sample latch 336. The first output of the E/Eb DAC device 352 outputs an offset-cancelation voltage to the second differential input (1) of the E latch 334 to cancel out the offset voltage at the E latch 334, where the offset-cancelation voltage is a voltage between the two lines of the second differential input (1). Similarly, the second output of the E/Eb DAC device 352 outputs an offset-cancelation voltage to the second differential input (1) of the Eb latch 336 to cancel out the offset voltage at the Eb latch 336, where the offset-cancelation voltage is a voltage between the two lines of the second differential input (1). As discussed further below, the offset-cancelation voltages to the E and Eb latches 334 and 336 may be adjusted depending on the target voltage level for the data signal.

In one embodiment, the E/Eb register 342 stores a plurality of digital offset codes for the E latch 334, where each offset code corresponds to a different target voltage level for the data signal. Similarly, the E/Eb register 342 stores a plurality of digital offset codes for the Eb latch 336, where each offset code corresponds to a different target voltage level for the data signal. In this embodiment, for a particular target voltage level, the E/Eb register 342 outputs the corresponding offset codes for the E and Eb latches 344 and 336 to the E/Eb DAC device 352. The E/Eb DAC device 352 converts the offset codes into the corresponding offset-cancelation voltages, and outputs the offset-cancelation voltages to the E and Eb latches 334 and 336. The E/Eb DAC device 352 may comprise a separate DAC for each latch, in which the DAC for each latch receives the offset code for the latch from the E/Eb register 342, and outputs the corresponding offset-cancelation voltage to the latch. An offset calibration process for determining the offset-cancelation voltages for the E and Eb latches 334 and 336 at large signal conditions is discussed further below.

Operations of the DFE 360 will now be described according to embodiments of the present disclosure. The DFE 360 is used to compensate for inter symbol interference (ISI) in the input data signal. In one exemplary embodiment, the DFE 360 is a 5-tap DFE 360. In this embodiment, for each data sample, the DFE 360 computes an ISI cancelation value based on the five most recently decided bits to cancel out ISI from the five most recent data bits. The ISI cancelation value may comprise five tap values. Each tap value is computed based on a different one of the five most recently decided bits and is used to cancel out ISI from the respective bit. For example, a first one of the tap values (denoted tap1 value) may be computed based on the most recently decided bit to cancel out ISI from the bit immediately preceding the current data sample. Each tap value may comprise a tap magnitude and a tap sign, where the tap magnitude specifies the amplitude of the tap value and the tap sign specifies the polarity of the tap value.

After computing the tap values for a data sample, the DFE 360 may output corresponding tap codes to a DFE DAC device 362. The DFE DAC device 362 converts the taps codes to tap voltages corresponding to the tap values, and outputs the tap voltages to the summing amplifier 325. The summing amplifier 325 applies the tap voltages to the input data signal to remove ISI.

Figure 4:
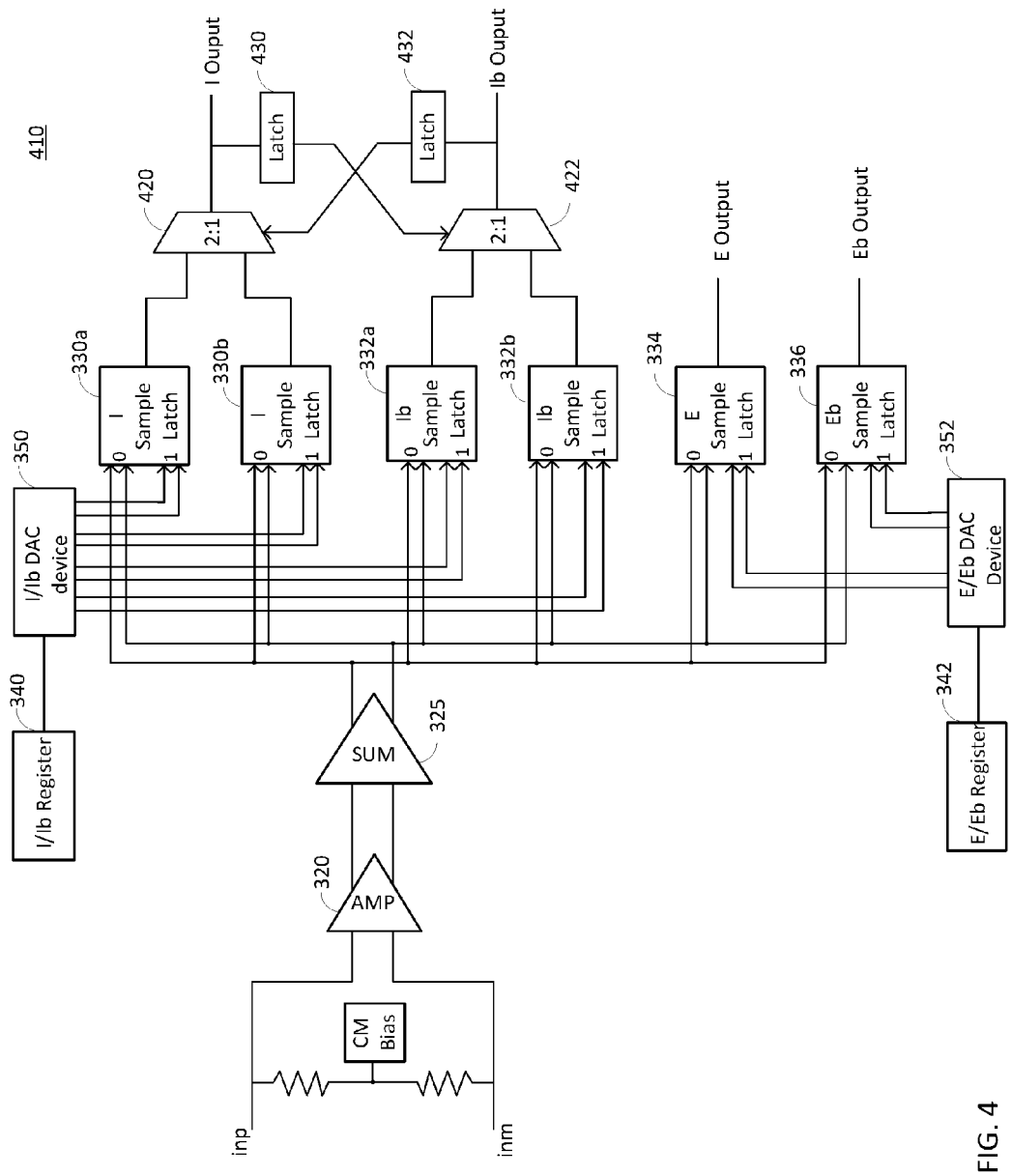
FIG. 4 shows a receiver with loop unrolling according to an embodiment of the present disclosure.

FIG. 4 shows a receiver 410 according to another embodiment. The receiver 410 is similar to the receiver 310 in FIG. 3, except that the receiver 410 comprises a pair of I latches 330a and 330b, and a pair of Ib latches 332a and 332b. For ease of illustration, the DFE 360 and the error processor 370 are not shown in FIG. 4. The pair of I latches 330a and 330b and the pair of Ib latches 332a and 332b enable decision feedback equalization with loop unrolling, as discussed further below.

A challenge of employing decision feedback equalization in a high-speed receiver is that the immediately preceding bit needs to be decided in a short amount of time (e.g., half a clock cycle) in order to be used for the current data sample. Loop unrolling provides the receiver with more time to decide the immediately preceding bit while also providing ISI cancelation for the immediately preceding bit. Loop unrolling accomplishes this by performing ISI cancelation for a data sample at one latch assuming the immediately preceding bit is a one and at another latch assuming the immediately preceding bit is a zero. After the value of the immediately preceding bit is decided, the output of the latch corresponding to the correct bit value is selected. Thus, loop unrolling involves performing ISI cancelation for both possible values of the immediately preceding bit, and, once the correct value is known, selecting the output of the latch corresponding to the correct bit value. Loop unrolling reduces power consumption by relaxing timing constraints for deciding the bit value of a data sample.

In operation, the DFE 360 computes tap values for the second through fifth taps of the DFE (denoted tap2 value to tap5 value), and outputs the corresponding tap codes to the DFE DAC device 362. The DFE DAC device 362 converts the taps codes to tap voltages corresponding to the second through fifth tap values, and outputs the tap voltages to the summing amplifier 325. The summing amplifier 325 applies the tap voltages to the input data signal. Thus, in this embodiment, ISI cancelation for the second through fifth taps of the DFE is performed at the summing amplifier 325. ISI cancelation for the first tap is performed at the latches to enable loop unrolling of the first tap, as discussed further below. In general, for a n-tap DFE, ISI cancelation for the second through $n^{th}$ taps may be performed at the summing amplifier 325.

The I/Ib DAC device 350 outputs a tap voltage to I latch 330a corresponding to a tap1 value in which the immediately preceding bit is assumed to be a one, and outputs a tap voltage to I latch 330b corresponding to a tap1 value in which the immediately preceding bit is assumed to be a zero, or vice versa. The tap1 values for the I latches 330a and 330b may have the same tap magnitude and opposite tap signs (i.e., same amplitude and opposite polarities). Thus, ISI cancelation is performed at I latch 330a assuming the immediately preceding bit is one, and ISI cancelation is performed at I latch 330b assuming the immediately preceding bit is zero, or vice versa.

Similarly, the I/Ib DAC device 350 outputs a tap voltage to Ib latch 332a corresponding to a tap1 value in which the immediately preceding bit is assumed to be a one, and outputs a tap voltage to Ib latch 332b corresponding to a tap1 value in which the immediately preceding bit is assumed to be a zero, or vice versa. The tap1 values for the Ib latches 332a and 332b may have the same tap magnitude and opposite tap signs. Thus, ISI cancelation is performed at Ib latch 332a assuming the immediately preceding bit is one, and ISI cancelation is performed at Ib latch 332b assuming the immediately preceding bit is zero, or vice versa.

The outputs of the I latches 330a and 330b are input to a first multiplexer 420. Once the value of the immediately preceding bit is known for a data sample, the first multiplexer 420 selects the output of the I latch 330a and 330b corresponding to the correct bit value, and outputs the selected output (denoted I output) to the DFE 360. Similarly, the outputs of the Ib latches 332a and 332b are input to a second multiplexer 422. Once the value of the immediately preceding bit is known for a data sample, the second multiplexer 422 selects the output of the Ib latch 332a and 332b corresponding to the correct bit value, and outputs the selected output (denoted Ib output) to the DFE 360.

For the first multiplexer 420, the value of the immediately preceding bit is provided by the output (Ib output) of the second multiplexer 422 since the I latches sample even bits and the Ib latches sample odd bits. The output (Ib output) of the second multiplexer 422 is latched by latch 432 before being output to the first multiplexer 420 to ensure that timing constraints for deciding the value of the preceding bit are met. For the second multiplexer 422, the value of the immediately preceding bit is provided by the output (I output) of the first multiplexer 420. The output (I output) of the first multiplexer 420 is latched by latch 430 before being output to the second multiplexer 422 to ensure that timing constraints for deciding the value of the preceding bit are met.

Thus, in this embodiment, the voltage output to each of the I and Ib latches 330a to 332b by the I/Ib DAC device 350 comprises a sum of the respective offset-cancelation voltage and a tap voltage corresponding to the respective tap1 value.

An offset calibration process for determining the offset-cancelation voltages for the I and Ib latches 330a to 332b in the calibration mode will now be described according to an embodiment of the present disclosure.

To calibrate the offsets of the I and Ib latches 330a to 332b in the calibration mode, the differential output voltage of the summing amplifier 325 (voltage between the two lines of the differential output) is set to approximately zero volts. For example, a control signal may be used to control the output state of the summing amplifier 325. When the control signal is asserted, the differential output voltage of the summing amplifier 325 is set to zero volts while the common mode voltage (voltage common to the two lines of the differential output) is not changed.

After the differential output of the summing amplifier 325 is set to zero volts, the I and Ib latches 330a to 332b are calibrated. For each latch, the amplitude and/or polarity of the respective offset-cancelation voltage is adjusted until the output of the latch reaches a metastable state (toggles between one and zero), where the offset-cancelation voltage is a voltage between the two lines of the second differential input (1). This is done by sequentially inputting different offset codes to the I/Ib DAC device 350 for the latch and observing the output of the latch. The output of the latch reaches the metastable state when the offset-cancelation voltage cancels out the offset voltage at the input of the latch. Once the offset-cancelation voltage resulting in the metastable state is determined for the latch, the corresponding offset code is recorded in the I/Ib register 340 for the latch.

At the end of the calibration process, the I/Ib register 340 comprises an offset code for each of the I and Ib latches 330a to 332b. In the data mode, the offset code for each latch in the I/Ib register 340 is input to the I/Ib DAC device 350. The I/Ib DAC device 350 converts the offset code for each latch into the corresponding offset-cancelation voltage, and outputs the offset-cancelation voltage to the latch.

Operations of the E sample latch 334 and the Eb sample latch 336 in the data mode will now be described according to embodiments of the present disclosure. As discussed above, the output of each of the E and Eb latches 334 and 336 indicates whether a voltage level of the data signal is above or below a target voltage level. In one embodiment, the E/Eb DAC device 352 inputs a threshold voltage to the second differential input (1) of the E latch 334 corresponding to a target voltage level. As discussed further below, the threshold voltage may have approximately the same amplitude and opposite polarity of the target voltage level. The E/Eb DAC device 352 also inputs an offset-cancelation voltage to the second differential input (1) of the E latch 334 to cancel out the offset voltage at the latch. As discussed further below, the offset-cancelation voltage may be a function of the target voltage level. Thus, the E/Eb DAC device 352 inputs the sum of the threshold voltage and the offset-cancelation voltage to the second differential input (1). If the voltage level of the data signal at the first differential input (0) is approximately equal to the target voltage level, then the output of the E latch 334 is in a metastable state, assuming the offset voltage at the E latch 334 is canceled out by the offset-cancelation voltage. As discussed further below, the target voltage level may incorporate a tap1 value.

In this embodiment, the error processor 370 observes the output of the E latch 334 to determine whether the voltage level of the data signal is equal to the target voltage level. If the voltage level of the data signal is not equal to the target voltage level (i.e., output of the E latch 334 is not in metastable state), then the error processor 370 may adjust the magnitude of one or more taps of the DFE 360 and/or the gain of an amplifier (e.g., amplifier 320) until the voltage level of the data signal approximately equals the target voltage level (i.e., output of the E latch 334 reaches a metastable state).

Similarly, the E/Eb DAC device 352 inputs a threshold voltage to the second differential input (1) of the Eb latch 336 corresponding to a target voltage level. The threshold voltage may have approximately the same amplitude and opposite polarity of the target voltage level. The threshold voltage for the Eb latch 336 may be approximately the same as the threshold voltage for the E latch 334. For example, the E and Eb latches 334 and 336 may measure the voltage level of a data signal at the same polarity (e.g., polarity corresponding to a "1" bit). Alternatively, the threshold voltage for the Eb latch 336 may have approximately the same magnitude but opposite polarity as the threshold voltage for the E latch 334. This may be done, for example, when the E and Eb latches 334 and 336 are used to measure the voltage level of the data signal at different polarities of the data signal.

The E/Eb DAC device 352 also inputs an offset-cancelation voltage to the second differential input (1) of the Eb latch 336 to cancel out the offset voltage at the latch. As discussed further below, the offset-cancelation voltage may be a function of the target voltage level. Thus, the E/Eb DAC device 352 inputs the sum of the threshold voltage and the offset-cancelation voltage to the second differential input (1). If the voltage level of the data signal input at the first differential input (0) is approximately equal to the target voltage level, then the output of the Eb latch 336 is in a metastable state, assuming the offset voltage at the Eb latch 336 is canceled out by the offset-cancelation voltage. As discussed further below, the target voltage level may incorporate a tap1 value.

The error processor 370 observes the output of the Eb latch 336 to determine whether the voltage level of the data signal is equal to the target voltage level. If the voltage level of the data signal is not equal to the target voltage level (i.e., output of the Eb latch 336 is not in metastable state), then the error processor 370 may adjust the magnitude of one or more taps of the DFE 360 and/or the gain of an amplifier (e.g., amplifier 320) until the voltage level of the data signal approximately equals the target voltage level (i.e., output of the Eb latch 336 reaches a metastable state).

An offset calibration process for determining offset-cancelation voltages for the E and Eb latches 334 and 336 at large signal conditions will now be described according an embodiment.

Figure 5:
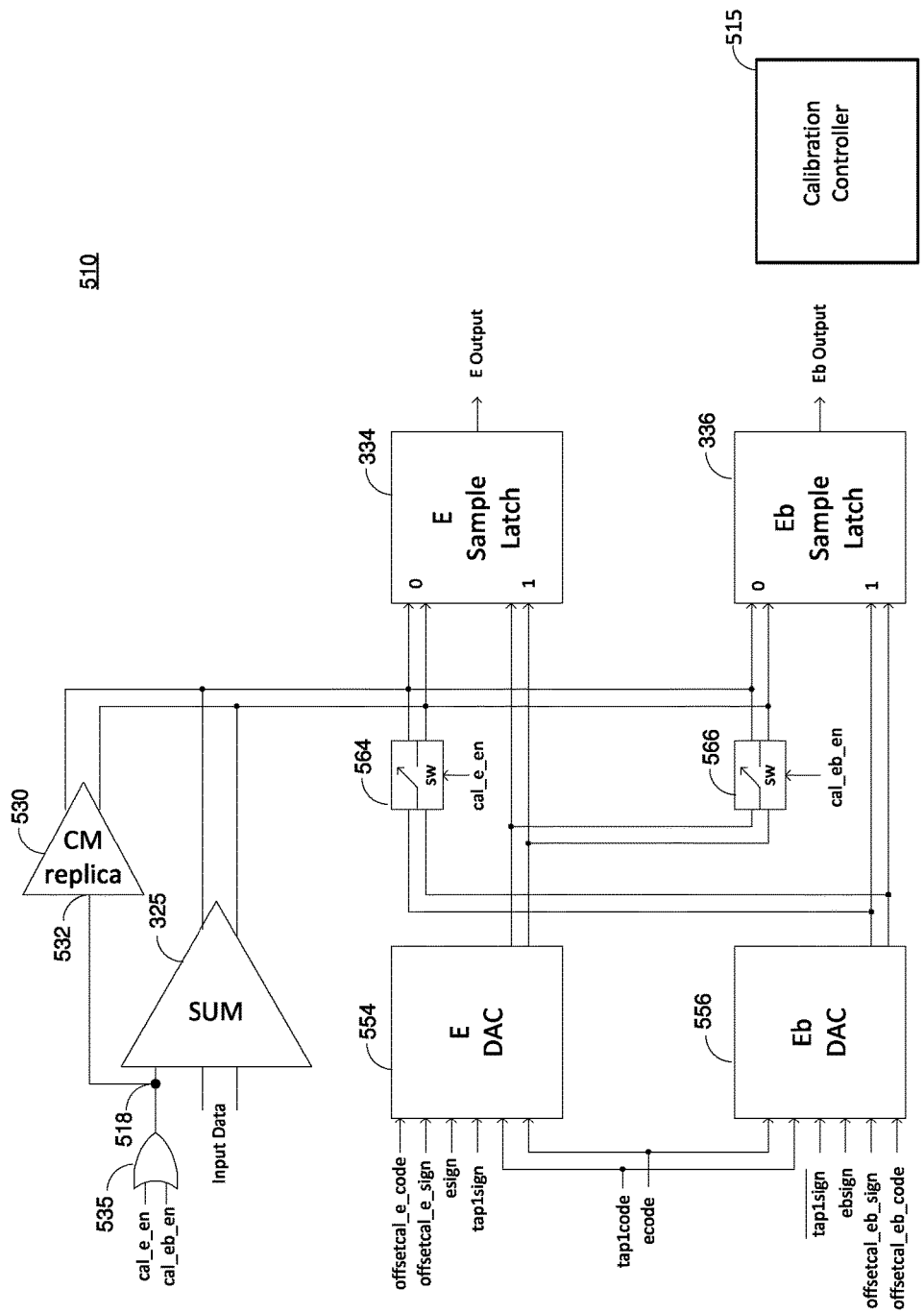
FIG. 5 shows a system for performing offset calibration at large signal conditions according to an embodiment of the present disclosure.

FIG. 5 shows a system 510 for performing offset calibration for the E and Eb latches 334 and 336 according to an embodiment. The system 510 comprises the summing amplifier 325, a common-mode (CM) replica circuit 530, an OR gate 535, the E and Eb latches 334 and 336, a first switch 564, and a second switch 566. The system 510 also comprises an E DAC 554 and an Eb DAC 556, both of which may be included in the E/Eb DAC device 352. The system 510 further comprises a calibration controller 515 for controlling the offset calibration process, as discussed further below.

In this embodiment, the summing amplifier 325 is a tri-state summing amplifier 325 with a control input 518 for selectively enabling the summing amplifier 325. When a logic zero is input to the control input 518, the summing amplifier 325 is enabled. In this case, the summing amplifier 325 amplifies an input data signal from the channel, and outputs the amplified data signal to the latches 330 to 336. When a logic one is input to the control input 518, the summing amplifier 325 is disabled. In this case, the input data signal is blocked from the output of the summing amplifier 325, and the output impedance of the summing amplifier 325 is high.

The CM replica circuit 530 is configured to generate a common-mode (CM) voltage replicating the output CM voltage of the summing amplifier 325. As discussed further below, when the summing amplifier 325 is disabled during offset calibration, the CM replica circuit 530 applies the replica CM voltage to the data paths of the latches 330 to 336, where the CM voltage is a voltage that is common to the two lines of the first differential input (0) of each latch. The CM replica circuit 530 has a control input 532 for selectively enabling the CM replica circuit 530. When a logic one is input to the control input 532, the CM replica circuit 530 is enabled, and, when a logic zero is input to the control input 532, the CM replica circuit 530 is disabled.

The OR gate 535 receives a calibration enable signal (denoted cal_e_en) for the E latch 334 at a first input, and receives a calibration enable signal (denoted cal_eb_en) for the Eb latch 336 at a second input. The output of the OR gate 535 is coupled to the control input 518 of the summing amplifier 325, and the control input 532 of the CM replica circuit 530.

In the data mode, the calibration controller 515 may set both calibration enable signals (cal_e_en and cal_eb_en) to zero. This causes the OR gate 535 to output a logic zero to the control input 518 of the summing amplifier 325 and the control input 532 of the CM replica circuit 530. As a result, the summing amplifier 325 is enabled and the CM replica circuit 530 is disabled. For ease of illustration, the connections between the calibration controller 515 and the OR gate 535 are not shown in FIG. 5.

In the calibration mode, the calibration controller 515 may set one of the calibration enable signals (cal_e_en and cal_eb_en) to one, depending on which one of the E and Eb latches 334 and 336 is under calibration at a given time. For example, the calibration controller 515 may set the calibration enable signal (cal_e_en) for the E latch 334 to one if offset calibration is being performed for the E latch 334, and set the calibration enable signal (cal_eb_en) for the Eb latch 336 to one if offset calibration is being performed for the Eb latch 336. In either case, the OR gate 535 outputs a logic one to the control input 518 of the summing amplifier 325 and the control input 532 of the CM replica circuit 530. As a result, the summing amplifier 325 is disabled and the CM replica circuit 530 is enabled. The CM replica 530 applies the replica of the output CM voltage of the summing amplifier 325 (which is disabled) to the data paths of the latches 330 to 336.

The E DAC 554 has an output coupled to the second differential input (1) of the E latch 334, and the Eb DAC 556 has an output coupled to the second differential input (1) of the Eb latch 336. The first switch 564 is configured to selectively couple the output of the Eb DAC 556 to the first differential input (0) of the E latch 334 under the control of the calibration enable signal (cal_e_en) for the E latch 334. When the calibration enable signal (cal_e_en) is one, the first switch 564 is closed causing the first switch 564 to couple (route) the output of the Eb DAC 556 to the first differential input (0) of the E latch 334, and, when the calibration enable signal (cal_e_en) is zero, the first switch 564 is open. Similarly, the second switch 566 is configured to selectively couple the output of the E DAC 554 to the first differential input (0) of the Eb latch 336 under the control of the calibration enable signal (cal_eb_en) for the Eb latch 336. When the calibration enable signal (cal_eb_en) is one, the second switch 566 is closed causing the second switch 566 to couple (route) the output of the E DAC 554 to the first differential input (0) of the Eb latch 336, and, when the calibration enable signal (cal_eb_en) is zero, the second switch 566 is open.

In the data mode, the calibration enable signals (cal_e_en and cal_eb_en) for the E and Eb latches 334 and 336 are zero, and both the first and second switches 564 and 566 are open. In this mode, the first differential input (0) of the E latch 334 and the first differential input (0) of the Eb latch 336 receive a data signal from the output of the summing amplifier 325. Operations of the switches 564 and 566 in the calibration mode are discussed further below.

In the example in FIG. 5, the E DAC 554 receives an offset code specifying the offset-cancelation voltage to be applied to the E latch 334. The offset code comprises a magnitude code (denoted offsetcal_e_code) specifying the magnitude of the offset-cancelation voltage and a sign bit (denoted offsetcal_e_sign) specifying the polarity of the offset-cancelation voltage. The E DAC 554 also receives a code specifying a tap1 voltage to be applied to the E latch 334. The code comprises a magnitude code (denoted tap1 code) specifying the magnitude of the tap1 voltage, and a sign bit (denoted tap1sign) specifying the polarity of the tap1 voltage. The E DAC 554 also receives a code specifying a voltage used to measure the voltage level at the first differential input (0) of the E latch 334. The code comprises a magnitude code (denoted ecode) specifying the magnitude of the voltage and a sign bit (denoted esign) specifying the polarity of the voltage. Thus, the E DAC 554 outputs a voltage to the second differential input (1) of the E latch 334 that is a sum of the offset-cancelation voltage, the tap1 voltage, and the voltage used to measure the voltage level at the first differential input (0).

The Eb DAC 556 receives an offset code specifying the offset-cancelation voltage to be applied to the Eb latch 336. The offset code comprises a magnitude code (denoted offsetcal_eb_code) specifying the magnitude of the offset-cancelation voltage and a sign bit (denoted offsetcal_eb_sign) specifying the polarity of the offset-cancelation voltage. The Eb DAC 556 also receives a code specifying a tap1 voltage to be applied to the Eb latch 336. The code comprises a magnitude code (denoted tap1 code) specifying the magnitude of the tap1 voltage, and a sign bit (denoted $\overline{\text{tap1sign}}$) specifying the polarity of the tap1 voltage. The Eb DAC 556 also receives a code specifying a voltage used to measure the voltage level at the first differential input (0) of the Eb latch 336. The code comprises a magnitude code (denoted ecode) specifying the magnitude of the voltage and a sign bit (denoted ebsign) specifying the polarity of the voltage. Thus, the Eb DAC 556 outputs a voltage to the second differential input (1) of the Eb latch 336 that is a sum of the offset-cancelation voltage, the tap1 voltage, and the voltage used to measure the voltage level at the first differential input (0).

In the example in FIG. 5, the E DAC 554 and the Eb DAC 556 receive the same code (tap1 code) for the magnitude of the tap1 voltage and opposite sign bits (tap1sign and $\overline{\text{tap1sign}}$) for the polarity of the tap1 voltage. The E DAC 554 and the Eb DAC 556 receive the same the ecode.

An example of offset calibration for the E latch 334 at large signal conditions will now be described according to an embodiment of the present disclosure. To calibrate the offset for the E latch 334, the calibration controller 515 sets the calibration enable signal (cal_e_en) for the E latch 334 to one and sets the calibration enable signal (cal_eb_en) for the Eb latch 336 to zero. This causes the first switch 564 to couple (route) the output of the Eb DAC 556 to the first differential input (0) of the E latch 334. The output of the E DAC 554 is coupled to the second differential input (1) of the E latch 334.

The calibration controller 515 may also set the tap1 code to zero and the tap1 sign bit to zero. Thus, a tap1 value is not applied to the E latch 334 during calibration. The calibration controller 515 may also set the esign bit and the ebsign sign to opposite logic values. Thus, the E DAC 554 and the Eb DAC 556 output voltages have the same magnitude (specified by the ecode) and opposite polarities. The logic value of the ebsign bit depends on the desired polarity of the voltage at the first differential input (0) of the E latch 334.

The calibration controller 515 may perform offset calibration for a first differential input voltage level (e.g., 200 mV). To do this, the calibration controller 515 sets the ecode to a value corresponding to the first input voltage level. This causes the Eb DAC 556 to output the first voltage level (e.g., 200 mV) to the first differential input (0) of the E latch 334, and the E DAC 554 to output the negative of the first voltage level (e.g., −200 mV) to the second differential input (1) of the E latch 334. In this example, the output of the Eb DAC 556 simulates a data signal having a differential voltage level equal to the first voltage level (e.g., 200 mV), where the differential voltage level is between the two lines of the first differential input (0) of the E latch 334. The CM voltage provided by the CM replica circuit 530 is common to both lines of the first differential input (0) of the E latch 334.

The output of the E latch 334 enters a metastable state (toggles between one and zero) when voltages of equal magnitude and opposite polarities are applied to the first differential input (0) and second differential input (1) of the E latch 334, and the offset voltage at the E latch 334 is canceled out. Thus, in this example, the output of the E latch 334 enters a metastable state when the offset-cancelation voltage applied to the E latch 334 cancels out the offset voltage.

In this regard, the calibration controller 515 adjusts the magnitude and/or polarity of the offset-cancelation voltage to the second differential input (1) of the E latch 334 while observing the output of the E latch 334. The calibration controller 515 adjusts the magnitude and/or polarity of the offset-cancelation voltage by sequentially inputting different offset codes (offset_e_code and/or the offset_e_sign) to the E DAC 554. The calibration controller 515 adjusts the offset-cancelation voltage until the output of the E latch 334 reaches a metastable state. When the metastable state is reached, the calibration controller 515 records the offset code resulting in the metastable state in the E/Eb register 342, in which the offset code is associated with the first voltage level (e.g., 200 mV) in the E/Eb register 342. Thus, the offset code is calibrated for the first voltage level (e.g., 200 mV).

The calibration controller 515 may repeat the above process for each one of a plurality of other differential input voltage levels (e.g., 150 mV, 180 mV, 220 mV and 250 mV) to determine an offset-cancelation voltage for each one of the other input voltage levels. For each input voltage level, the calibration controller 515 may record the resulting offset-cancelation voltage in the E/Eb register 342. For example, the calibration controller 515 may generate an offset lookup table for the E latch 334, in which the lookup table maps the different input voltage levels (e.g., 150 mV, 180 mV, 200 mV, 220 mV and 250 mV) to the corresponding offset-cancelation voltages. The calibration controller 515 may store the lookup table in the E/Eb register 342.

Figure 6:
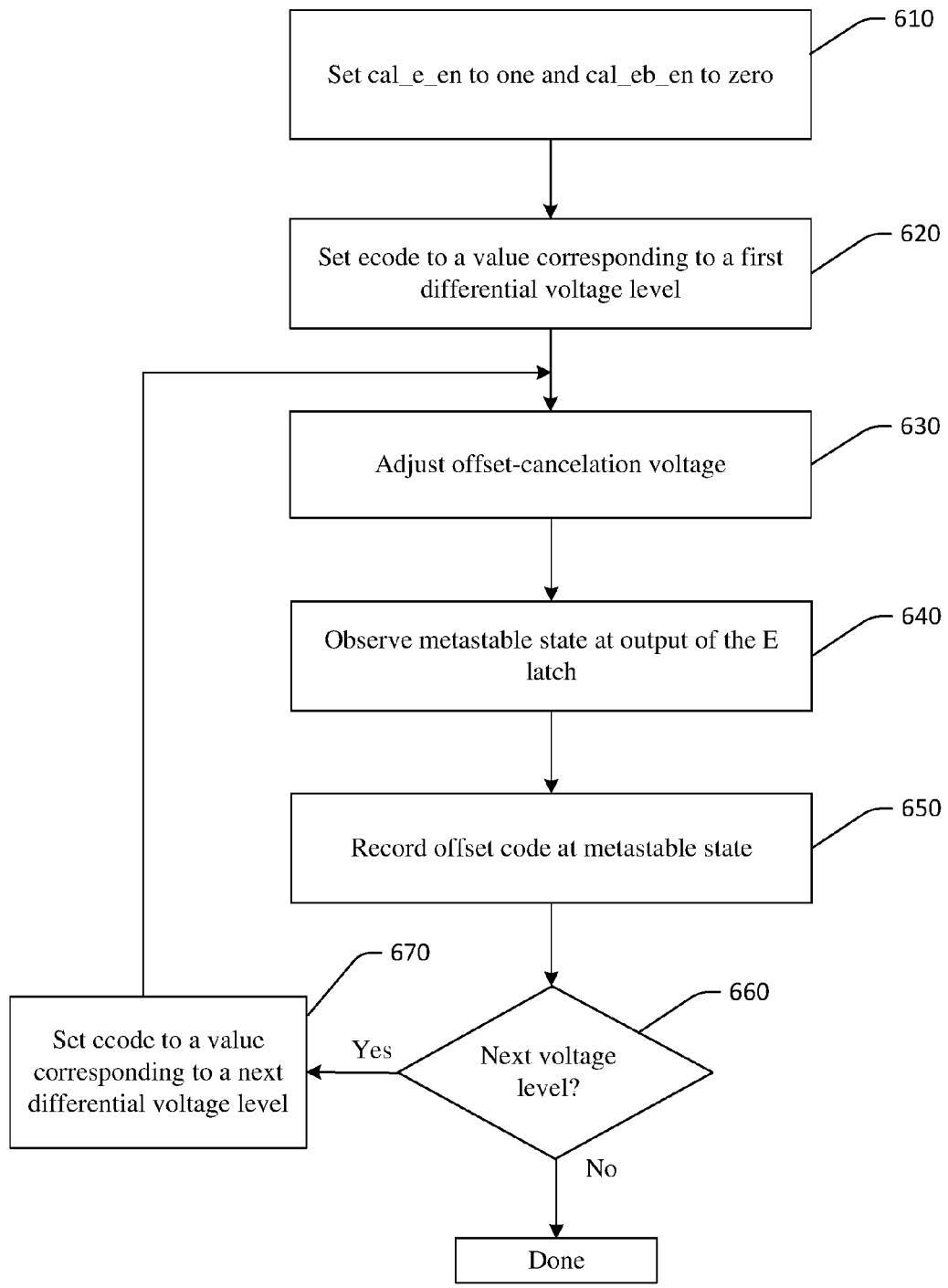
FIG. 6 is a flowchart illustrating a method for performing offset calibration at large signal conditions for an error (E) latch according to an embodiment of the present disclosure.

FIG. 6 is a flowchart summarizing the offset calibration method for the E latch 334 discussed above. The method may be performed by the calibration controller 515.

In step 610, the calibration enable signal (cal_e_en) for the E latch 334 is set to one and the calibration enable signal (cal_eb_en) for the Eb latch 336 is set to zero. This causes the first switch 564 to couple (route) the output of the Eb DAC 556 to the first differential input (0) of the E latch 334.

In step 620, the ecode is set to a value corresponding to a first differential voltage level (e.g., 200 mV). The Eb DAC 556 outputs the differential voltage level to the first differential input (0) of the E latch 334, and the E DAC 554 outputs the negative of the first voltage level to the second differential input (1) of the E latch 334.

In step 630, the offset-cancelation voltage is adjusted. This may be done, for example, by inputting different offset codes (offset_e_code and/or the offset_e_sign) to the E DAC 554. While the offset-cancelation voltage is adjusted, the output of the E latch 334 is observed for the metastable state. In step 640, the metastable state is observed at the output of the E latch 334. In step 650, the offset code resulting in the metastable state is recorded. For example, the offset code may be recorded in the E/Eb register 342 and associated with the first voltage level in the E/Eb register 342.

In step 660, a determination is made whether there is another differential voltage level for which offset calibration is to be performed. If not, then the method ends. If so, then the method proceeds to step 670, in which the ecode is set to a value corresponding to the next differential voltage level for which offset calibration is to be performed. The method then returns to step 630 to perform offset calibration for the next voltage level.

The offset codes for the E latch 334 at the different voltage levels may be stored in an offset lookup table in the E/Eb register 342, in which each offset code is mapped to the corresponding voltage level. As discussed further below, in the data mode, the offset code corresponding to a target voltage level for the data signal is input to the E DAC 554 to apply the corresponding offset-cancelation voltage to the E latch 334.

Offset calibration for the Eb latch 336 at large signal conditions may be performed in a manner similar to that described above for the E latch 334. In one embodiment, to calibrate the offset for the Eb latch 336, the calibration controller 515 sets the calibration enable signal (cal_e_en) for the E latch 334 to zero and sets the calibration enable signal (cal_eb_en) for the Eb latch 336 to one. This causes the second switch 566 to couple (route) the output of the E DAC 554 to the first differential input (0) of the Eb latch 336. The output of the Eb DAC 556 is coupled to the second differential input (1) of the Eb latch 336.

The calibration controller 515 may also set the tap1 code to zero and the tap1 sign bit to zero. The calibration controller 515 may further set the ebsign bit and the esign bit to opposite logic values. Thus, the E DAC 554 and the Eb DAC 556 output voltages having the same magnitude (specified by the ecode) and opposite polarities. The logic value of the esign bit depends on the desired polarity of the voltage at the first differential input (0) of the Eb latch 336.

The calibration controller 515 may perform offset calibration for a first differential input voltage level (e.g., 200 mV). To do this, the calibration controller 515 sets the ecode to a value corresponding to the first input voltage level. This causes the E DAC 554 to output the first voltage level (e.g., 200 mV) to the first differential input (0) of the Eb latch 336, and the Eb DAC 556 to output the negative of the first voltage level (e.g., −200 mV) to the second differential input (1) of the Eb latch 336. In this example, the output of the E DAC 554 simulates a data signal having a differential voltage level approximately equal to the first voltage level (e.g., 200 mV), where the differential voltage level is between the two lines of the first differential input (0) of the Eb latch 336. The CM voltage provided by the CM replica circuit 530 is common to both lines of the differential input (0) of the Eb latch 336. It is to be appreciated that the first voltage level used in offset calibration for the Eb latch 336 may differ from the first voltage level used in offset calibration for the E latch 334.

The calibration controller 515 adjusts the magnitude and/or polarity of the offset-cancelation voltage to the second differential input (1) of the Eb latch 336 while observing the output of the Eb latch 336. The calibration controller 515 adjusts the magnitude and/or polarity of the offset-cancelation voltage by inputting different offset codes (offset_eb_code and/or the offset_eb_sign) to the Eb DAC 556. The calibration controller 515 adjusts the offset-cancelation voltage until the output of the Eb latch 336 reaches a metastable state. When the metastable state is reached, the calibration controller 515 records the offset code resulting in the metastable state in the E/Eb register 342, in which the offset code is associated with the first voltage level in the E/Eb register 342.

The calibration controller 515 may repeat the above process for each one of a plurality of other differential input voltage levels to determine an offset-cancelation voltage for each one of the other input voltage levels. For each input voltage level, the calibration controller 515 may record the resulting offset-cancelation voltage in the E/Eb register 342. For example, the calibration controller 515 may generate an offset lookup table for the Eb latch 336, in which the lookup table maps the different input voltage levels to the corresponding offset-cancelation voltages. The calibration controller 515 may store the lookup table in the E/Eb register 342.

Figure 7:
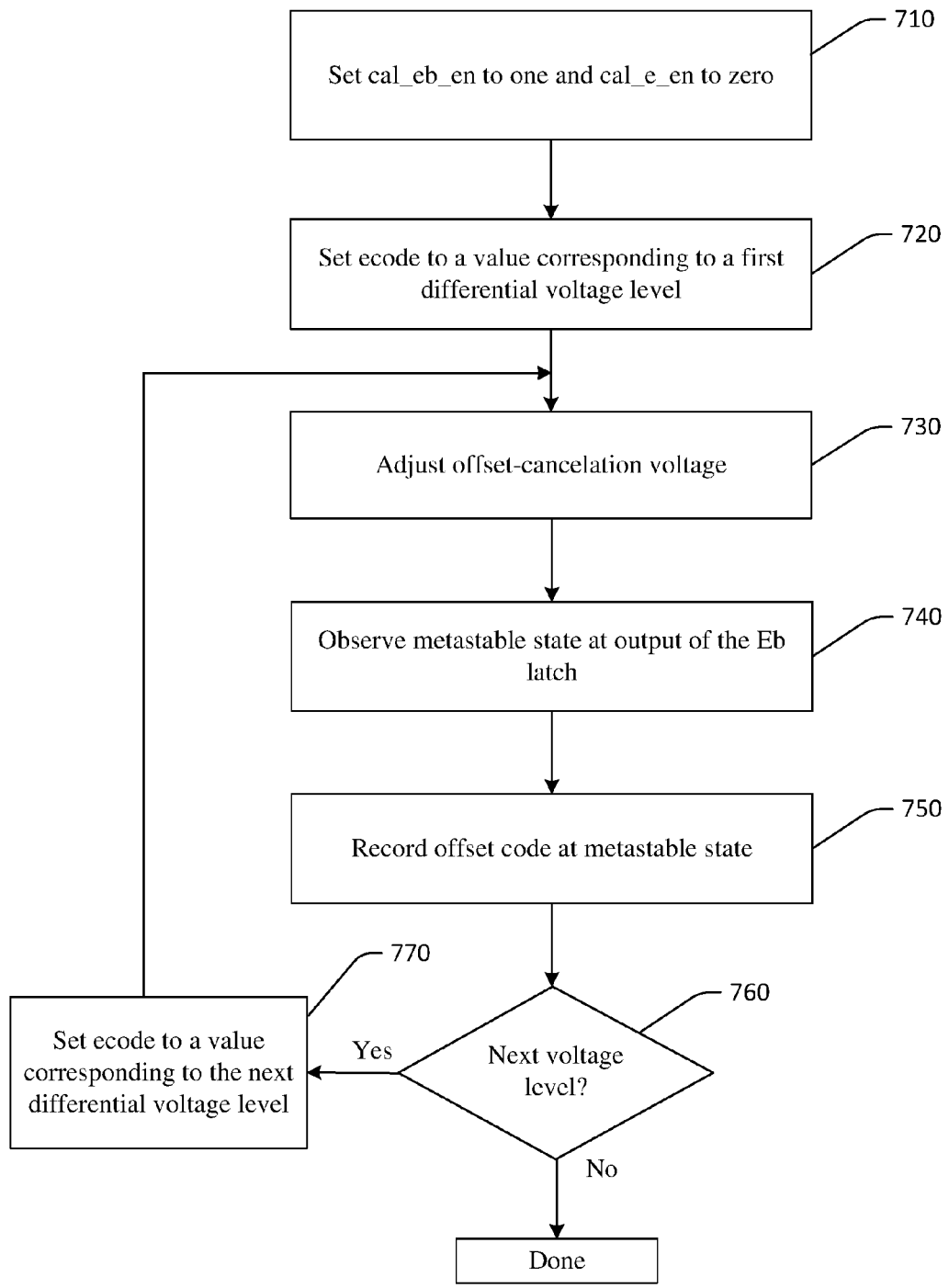
FIG. 7 is a flowchart illustrating a method for performing offset calibration at large signal conditions for an Eb latch according to an embodiment of the present disclosure.

FIG. 7 is a flowchart summarizing the offset calibration method for the Eb latch 336 discussed above. The method may be performed by the calibration controller 515.

In step 710, the calibration enable signal (cal_eb_en) for the Eb latch 336 is set to one and the calibration enable signal (cal_e_en) for the E latch 334 is set to zero. This causes the second switch 566 to couple (route) the output of the E DAC 554 to the first differential input (0) of the Eb latch 336.

In step 720, the ecode is set to a voltage corresponding to a first differential voltage level. The E DAC 554 outputs the differential voltage level to the first differential input (1) of the Eb latch 336, and the Eb DAC 556 outputs the negative of the first voltage level to the second differential input (1) of the Eb latch 336.

In step 730, the offset-cancelation voltage is adjusted. This may be done, for example, by inputting different offset codes (offset_eb_code and/or the offset_eb_sign) to the Eb DAC 556. While the offset-cancelation voltage is adjusted, the output of the Eb latch 336 is observed for the metastable state. In step 740, the metastable state is observed at the output of the E latch 336. In step 750, the offset code resulting in the metastable state is recorded. For example, the offset code may be recorded in the E/Eb register 342 and associated with the first voltage level in the E/Eb register 342.

In step 760, a determination is made whether there is another differential voltage level for which offset calibration is to be performed. If not, then the method ends. If so, then the method proceeds to step 770, in which the ecode is set to a value corresponding to the next differential voltage level for which offset calibration is to be performed. The method then returns to step 730 to perform offset calibration for the next voltage level.

The offset codes for the Eb latch 336 at the different voltage levels may be stored in an offset lookup table in the E/Eb register 342, in which each offset code is mapped to the corresponding voltage level. As discussed further below, in the data mode, the offset code corresponding to a target voltage level for the data signal is input to the Eb DAC 556 to apply the corresponding offset-cancelation voltage to the Eb latch 336.

Operations for setting the offset-cancelation voltage for the E latch 334 in the data mode will now be described according to an embodiment of the present disclosure. The error processor 370 determines a target differential voltage level for the data signal at the first differential input (0) of the E latch 334 based on the ecode, the tap1code, the esign bit and the tap1sign bit. For example, if the ecode and esign correspond to a voltage level of −120 mV, and the tap1code and tap1sign bit correspond to a voltage level of −40 mV, then the target voltage level for the data signal may be 160 mV. In this example, the threshold voltage applied to the second input (1) of the E latch 334 is the sum of the voltage level corresponding to the ecode and esign and the voltage level corresponding to the tap1code and tap1sign bit, and has the same amplitude and opposite polarity of the target voltage level (e.g., 160 mV) for the data signal (i.e., causes the output of the E latch 334 to enter a metastable when the voltage level of the data signal equals the target voltage level and offset is canceled out).

Once the target differential voltage level is determined, the error processor 370 retrieves the offset code in the E/Eb register 342 corresponding to the target voltage level. For example, the error processor 370 may consult the offset lookup table for the E latch 334 in the E/Eb register 342, and select the offset code corresponding to the target voltage level. For example, if the target voltage level is 160 mV, then the error processor retrieves the offset set corresponding to a voltage level of 160 mV.

The error processor 370 then inputs the selected offset code to the E DAC 554. The E DAC 554 converts the offset code into the corresponding offset-cancelation voltage and outputs the offset-cancelation voltage to the second differential input (1) of the E latch 334 to cancel out the offset voltage at the E latch 334 for the target voltage level.

In one aspect, the tap1code and tap1sign bit may be set according to a fixed tap1 value that assumes the immediately preceding bit is a one or zero. In this aspect, each time the error processor 370 receives an E output bit from the E latch 334, the error processor 370 may receive the value of the preceding bit from the first multiplexer 420, and compare the received bit value with the assumed bit value. If they match, then the error processor 370 may assume the E output bit is valid, and use the E output bit to detect the voltage level of the data signal. If they do not match, then the error processor 370 may assume the E output bit is invalid, and discard the E output bit. Assuming the data signal has approximately equal number of ones and zeros, about half of the E output bits will be valid. This aspect simplifies the receiver and reduces power consumption by allowing the use one E latch instead of two.

Operations for setting the offset-cancelation voltage for the Ed latch 336 in the data mode will now be described according to an embodiment of the present disclosure. The error processor 370 determines a target differential voltage level for the data signal at the first differential input (0) of the Eb latch 334 based on the ecode, the tap1code, the ebsign bit and $\overline{\text{tap1sign}}$ bit. In this example, the threshold voltage applied to the second input (1) of the Eb latch 336 is the sum of the voltage level corresponding to the ecode and ebsign and the voltage level corresponding to the tap1code and $\overline{\text{tap1sign}}$ bit, and has the same amplitude and opposite polarity of the target voltage level for the data signal (i.e., causes the output of the Eb latch 336 to enter a metastable when the voltage level of the data signal equals the target voltage level and offset is canceled out).

Once the target differential voltage level is determined, the error processor 370 retrieves the offset code in the E/Eb register 342 corresponding to the target voltage level. For example, the error processor 370 may consult the offset lookup table for the Eb latch 336 in the E/Eb register 342, and select the offset code corresponding to the target voltage level. The error processor 370 then inputs the selected offset code to the Eb DAC 556. The Eb DAC 556 converts the offset code into the corresponding offset-cancelation voltage and outputs the offset-cancelation voltage to the second input (1) of the Eb latch 336 to cancel out offset voltage at the Eb latch 336 for the target voltage level.

In one aspect, the tap1code and $\overline{\text{tap1sign}}$ bit may be set according to a fixed tap1 value that assumes the immediately preceding bit is a one or zero. In this aspect, each time the error processor 370 receives an Eb output bit from the Eb latch 336, the error processor 370 may receive the value of the preceding bit from the second multiplexer 422, and compare the received bit value with the assumed bit value. If they match, then the error processor 370 may assume the Eb output bit is valid, and use the Eb output bit to detect the voltage level of the data signal. Otherwise, the error processor 370 may assume the Eb output bit is invalid, and discard the Eb output bit.

Figure 8:
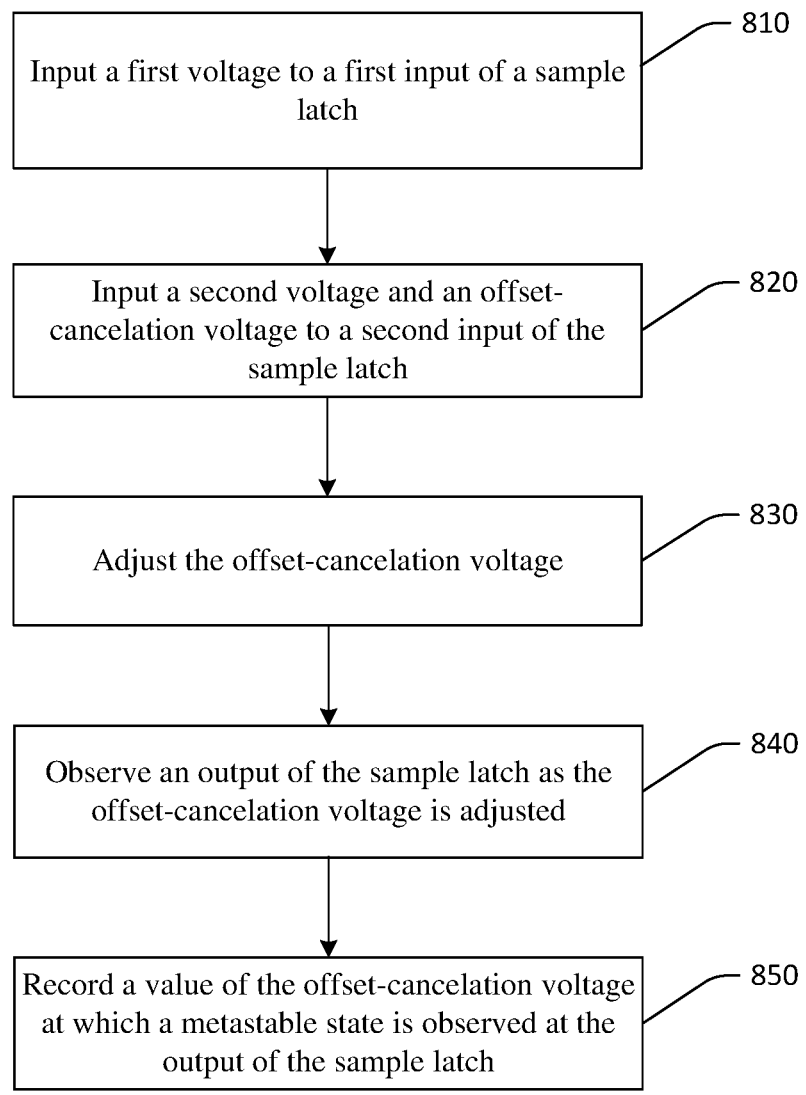
FIG. 8 is a flowchart illustrating a method for offset calibration according to an embodiment of the present disclosure.

FIG. 8 is a flowchart illustrating a method 800 for offset calibration according to an embodiment of the present disclosure. The method 800 may be performed by the calibration controller 515.

In step 810, a first voltage is input to a first input of a sample latch. For example, the first voltage may be input to the first differential input (0) of the E latch 334 to perform offset calibration for the E latch 334. The first voltage may be referred to as a calibration voltage since the offset may be calibrated for the first voltage. The first voltage may be a differential voltage having a magnitude of at least 50 mV.

In step 820, a second voltage and an offset-cancelation voltage are input to a second input of the sample latch. For example, a sum of the second voltage and the offset-cancelation voltage may be input to the second differential input (1) of the E latch 334 to perform offset calibration for the E latch 334. The second voltage may have approximately the same magnitude and opposite polarity as the first voltage.

In step 830, the offset-cancelation voltage is adjusted. For example, the offset-cancelation voltage may be adjusted by inputting different offset codes to a DAC (e.g., E DAC 554) used to generate the offset-cancelation voltage.

In step 840, an output of the sample latch is observed as the offset-cancelation voltage is adjusted. In step 850, a value of the offset-cancelation voltage at which a metastable state is observed at the output of the sample latch is recorded. For example, the offset code at which the metastable state is observed may be recorded in the E/Eb register 342. In the data mode, the recorded offset code may be used for offset cancelation when a target voltage level for a data signal corresponds to the first voltage. The method 800 may be repeated for each one of a plurality of different voltage levels to determine an offset-cancelation voltage for each voltage level.

Those skilled in the art will appreciate that the various illustrative logical blocks, circuits, and steps described in connection with the disclosure herein may be implemented as electronic hardware, computer software, or combinations of both. To clearly illustrate this interchangeability of hardware and software, various illustrative components, blocks, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A method for offset calibration, comprising:
   in a calibration mode, performing the steps of:
      inputting a calibration voltage to a first input of a sample latch in a receiver;
      inputting a threshold voltage and an offset-cancelation voltage to a second input of the sample latch;
      adjusting the offset-cancelation voltage;
      observing an output of the sample latch as the offset-cancelation voltage is adjusted; and
      storing a value of the offset-cancelation voltage at which a metastable state is observed at the output of the sample latch in a memory; and
   in a data mode, performing the steps of:
      retrieving the value of the offset-cancelation voltage from the memory;
      setting the offset-cancelation voltage according to the retrieved value;
      inputting the threshold voltage and the set offset-cancelation voltage to the second input of the sample latch, wherein the set offset-cancelation voltage cancels out an offset voltage at the sample latch; and
      inputting a data signal to the first input of the sample latch.

2. The method of claim 1, wherein the threshold voltage corresponds to a target voltage level for the data signal.

3. The method of claim 2, wherein, in the data mode, the sample latch is configured to output a bit value of one or zero depending on whether a voltage of the data signal is above or below the target voltage level.

4. The method of claim 1, wherein the calibration voltage and the threshold voltage have the same magnitude and opposite polarities.

5. The method of claim 1, wherein the threshold voltage has a magnitude of at least 50 mV.

6. The method of claim 1, wherein, in the data mode, the method further comprises:
   observing the output of the sample latch; and
   adjusting a gain of an amplifier until a metastable state is observed at the output of the sample latch, wherein the amplifier amplifies the data signal before the data signal is input the first input of the sample latch.

7. An apparatus for offset calibration, comprising:
   means for inputting, in a calibration mode, a calibration voltage to a first input of a sample latch;
   means for inputting, in the calibration mode, a threshold voltage and an offset-cancelation voltage to a second input of the sample latch;

means for adjusting, in the calibration mode, the offset-cancelation voltage;
means for observing, in the calibration mode, an output of the sample latch as the offset-cancelation voltage is adjusted;
means for storing a value of the offset-cancelation voltage at which a metastable state is observed at the output of the sample latch;
means for retrieving, in a data mode, the stored value of the offset-cancelation voltage;
means for setting, in the data mode, the offset-cancelation voltage according to the retrieved value;
means for inputting, in the data mode, the threshold voltage and the set offset-cancelation voltage to the second input of the sample latch, wherein the set offset-cancelation voltage cancels out an offset voltage at the sample latch; and
means for inputting, in the data mode, a data signal to the first input of the sample latch.

8. The apparatus of claim 7, wherein the threshold voltage corresponds to a target voltage level for the data signal.

9. The apparatus of claim 8, wherein, in the data mode, the sample latch is configured to output a bit value of one or zero depending on whether a voltage of the data signal is above or below the target voltage level.

10. The apparatus of claim 7, wherein the calibration voltage and the threshold voltage have the same magnitude and opposite polarities.

11. The apparatus of claim 7, wherein the threshold voltage has a magnitude of at least 50 mV.

12. The apparatus of claim 7, further comprising:
means for observing the output of the sample latch in the data mode; and
means for adjusting a gain of an amplifier until a metastable state is observed at the output of the sample latch, wherein the amplifier amplifies the data signal before the data signal is input the first input of the sample latch.

13. A receiver, comprising:
a sample latch having a first input coupled to a receive data path, and a second input;
a first digital-to-analog converter (DAC);
a second DAC;
a calibration controller, wherein, in a calibration mode, the calibration controller is configured to input a calibration voltage to the first input of the sample latch using the first DAC, to input a threshold voltage and an offset-cancelation voltage to the second input of the sample latch using the second DAC, to adjust the offset-cancelation voltage, to observe an output of the sample latch as the offset-cancelation voltage is adjusted, and to store a value of the offset-cancelation voltage at which a metastable state is observed at the output of the sample latch in a memory; and
a processor, wherein, in a data mode, the processor is configured to retrieve the value of the offset-cancelation voltage from the memory, to set the offset-cancelation voltage according to the retrieved value, and to input the threshold voltage and the set offset-cancelation voltage to the second input of the sample latch using the second DAC, wherein the set offset-cancelation voltage cancels out an offset voltage at the sample latch
wherein the sample latch receives a data signal at the first input via the receive data path in the data mode.

14. The receiver of claim 13, wherein the threshold voltage corresponds to a target voltage level for the data signal.

15. The receiver of claim 14, wherein, in the data mode, the sample latch is configured to output a bit value of one or zero depending on whether a voltage of the data signal is above or below the target voltage level.

16. The receiver of claim 14, further comprising:
an amplifier configured to amplify the data signal before the data signal is received at the first input of the sample latch;
wherein, in the data mode, the processor is configured to observe the output of the sample latch, and to adjust a gain of the amplifier until a metastable state is observed at the output of the sample latch.

17. The receiver of claim 13, wherein the calibration voltage and the threshold voltage have the same magnitude and opposite polarities.

18. The receiver of claim 13, wherein the threshold voltage has a magnitude of at least 50 mV.

19. A method for offset calibration, comprising:
in a calibration mode, performing the steps of:
determining a plurality of values for an offset-cancelation voltage, wherein each of the plurality of values for the offset-cancelation voltage corresponds to a different target voltage level; and
storing the plurality of values for the offset-cancelation voltage in a memory; and
in a data mode, performing the steps of:
determining a target voltage level for a data signal;
retrieving one of the plurality of values for the offset-cancelation voltage corresponding to the determined target voltage level from the memory;
setting the offset-cancelation voltage according to the retrieved value;
inputting the data signal to a first input of a sample latch; and
inputting a threshold voltage and the set offset-cancelation voltage to a second input of the sample latch, wherein the set offset-cancelation voltage cancels out an offset voltage at the sample latch.

20. The method of claim 19, wherein the threshold voltage corresponds to the determined target voltage level for the data signal.

21. The method of claim 20, wherein, in the data mode, the sample latch is configured to output a bit value of one or zero depending on whether a voltage of the data signal is above or below the determined target voltage level.

22. The method of claim 20, wherein the determined target voltage level and the threshold voltage have the same magnitude and opposite polarities.

23. The method of claim 19, wherein determining the plurality of values for the offset-cancelation voltage comprises:
for each of the plurality of values, performing the steps of:
inputting a calibration voltage to the first input of the sample latch, wherein the calibration voltage corresponds to the respective target voltage level;
inputting the threshold voltage and the offset-cancelation voltage to the second input of the sample latch, wherein the threshold voltage is set to a voltage level corresponding to the respective target voltage level;
adjusting the offset-cancelation voltage of the sample latch; and
observing an output of the sample latch as the offset-cancelation voltage is adjusted for a metastable state.

24. The method of claim 19, wherein determining the target voltage level for the data signal comprises determining the target voltage level for the data signal based on a magnitude code specifying a magnitude of a voltage level to be used to detect the data signal at the first input of the sample latch.

* * * * *